United States Patent
Peng et al.

(10) Patent No.: US 9,659,826 B2
(45) Date of Patent: May 23, 2017

(54) ASYMMETRIC SOURCE/DRAIN DEPTHS

(71) Applicant: Taiwan Semiconductor Manufacturing Company, Ltd., Hsin-Chu (TW)

(72) Inventors: Cheng-Yi Peng, Taipei (TW); Yu-Lin Yang, Hsinchu County (TW); Chia-Cheng Ho, Hsinchu (TW); Jung-Piao Chiu, Kaohsiung (TW); Tsung-Lin Lee, Hsinchu (TW); Chih Chieh Yeh, Taipei (TW); Chih-Sheng Chang, Hsinchu (TW); Yee-Chia Yeo, Albany, CA (US)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/369,635

(22) Filed: Dec. 5, 2016

(65) Prior Publication Data
US 2017/0084498 A1 Mar. 23, 2017

Related U.S. Application Data

(62) Division of application No. 14/582,431, filed on Dec. 24, 2014, now Pat. No. 9,515,071.

(51) Int. Cl.
| | |
|---|---|
| *H01L 29/06* | (2006.01) |
| *H01L 21/8238* | (2006.01) |
| *H01L 29/08* | (2006.01) |
| *H01L 29/10* | (2006.01) |
| *H01L 29/161* | (2006.01) |

(Continued)

(52) U.S. Cl.
CPC ........... *H01L 21/823814* (2013.01); *H01L 21/823807* (2013.01); *H01L 21/823821* (2013.01); *H01L 21/823878* (2013.01); *H01L 27/0924* (2013.01); *H01L 29/0653* (2013.01); *H01L 29/0847* (2013.01); *H01L 29/1054* (2013.01); *H01L 29/161* (2013.01); *H01L 29/20* (2013.01)

(58) Field of Classification Search
CPC ............... H01L 29/1054; H01L 21/823807
USPC ............... 257/19, 190, 316; 438/218
See application file for complete search history.

(56) References Cited

U.S. PATENT DOCUMENTS

| | | | |
|---|---|---|---|
| 7,335,545 B2* | 2/2008 | Currie | H01L 21/76254 257/E21.121 |
| 8,183,627 B2* | 5/2012 | Currie | H01L 21/82380 257/329 |

(Continued)

*Primary Examiner* — Jami M Valentine
(74) *Attorney, Agent, or Firm* — Haynes and Boone, LLP

(57) ABSTRACT

A method for fabricating a semiconductor device includes forming a relaxed semiconductor layer on a substrate, the substrate comprising an n-type region and a p-type region. The method further includes forming a tensile strained semiconductor layer on the relaxed semiconductor layer, etching a portion of the tensile strained semiconductor layer in the p-type region, forming a compressive strained semiconductor layer on the tensile strained semiconductor layer in the p-type region, forming a first gate in the n-type region and a second gate in the p-type region, and forming a first set of source/drain features adjacent to the first gate and a second set of source/drain features adjacent to the second gate. The second set of source/drain features are deeper than the first set of source/drain features.

20 Claims, 6 Drawing Sheets

(51) Int. Cl.
    *H01L 29/20*     (2006.01)
    *H01L 27/092*     (2006.01)

(56) References Cited

U.S. PATENT DOCUMENTS

| | | | |
|---|---|---|---|
| 8,604,573 B2* | 12/2013 | Yamakawa | H01L 43/08 257/421 |
| 8,878,161 B2* | 11/2014 | Lumb | H01L 29/882 257/14 |
| 2005/0093081 A1* | 5/2005 | Belyansky | H01L 21/82380 257/392 |
| 2010/0025771 A1* | 2/2010 | Hoentschel | H01L 21/26506 257/369 |
| 2010/0047977 A1* | 2/2010 | Clifton | H01L 29/1054 438/218 |
| 2011/0180854 A1* | 7/2011 | Ramdani | H01L 29/225 257/194 |
| 2014/0367741 A1* | 12/2014 | Yang | H01L 29/04 257/190 |
| 2015/0206874 A1* | 7/2015 | Son | H01L 27/088 257/401 |
| 2015/0311341 A1* | 10/2015 | Hur | H01L 21/02532 257/190 |

* cited by examiner

ASYMMETRIC SOURCE/DRAIN DEPTHS

PRIORITY INFORMATION

This application is a divisional of U.S. patent application Ser. No. 14/582,431 filed Dec. 24, 2014 and entitled "Asymmetric Source/Drain Depths," the disclosure of which is hereby incorporated by reference in its entirety.

BACKGROUND

Fabrication of integrated circuits involves forming large numbers of very small devices on a single wafer. As fabrication technologies improve, the devices become smaller such that more devices can fit within a smaller amount of space. A commonly formed device is a transistor. A transistor generally includes a gate terminal, a source terminal, and a drain terminal. A channel is positioned below the gate and between the source and drain terminals. Based on the signal applied to the gate, electric current is allowed or prevented from flowing through the channel. As the size at which semiconductor devices decreases, it is desirable to find methods and structures that allow for cost efficient devices with high performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
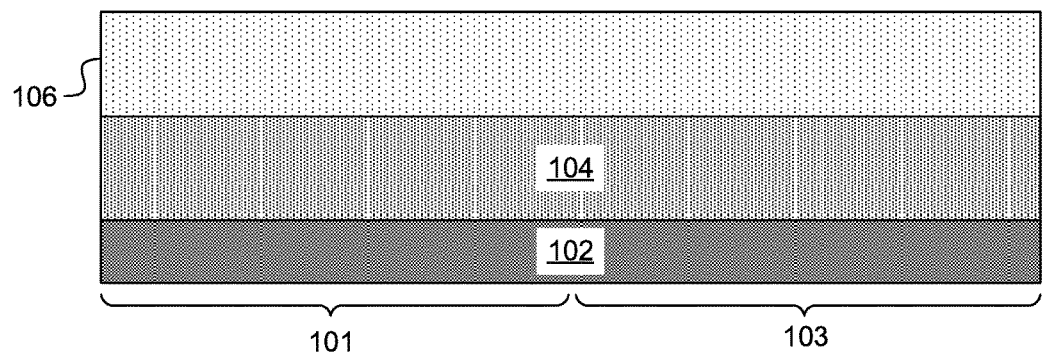
FIGS. 1A, 1B, 1C, 1D, 1E, 1F, 1G, and 1H are diagrams showing an illustrative process for forming devices with asymmetric source/drain feature depths, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to principles described herein, a semiconductor device has source/drain features that are at different depths between p-type and n-type transistors. Specifically, n-type devices have shallower source/drain features than p-type devices. The source/drain features of the n-type devices and p-type devices may vary in other ways to improve the performance of the devices. For example, the source/drain features of the n-type devices may have rounded profiles while the source/drain features of the p-type devices may have a profile with a tip or vertex.

FIGS. 1A-1H are diagrams showing an illustrative process for forming devices with asymmetric source/drain feature depths. FIG. 1A illustrates a semiconductor substrate 102 having an n-type region 101 and a p-type region 103. The semiconductor substrate 102 has a relaxed semiconductor layer 104 disposed thereon. A tensile strained semiconductor layer 106 is disposed on the relaxed semiconductor layer 104.

The semiconductor substrate 102 may be part of a semiconductor wafer. The semiconductor substrate 102 is made of a semiconductor material such as silicon. Other types of semiconductor material may be used as well. The semiconductor substrate 102 has an n-type region, meaning that it is intended for use with n-type transistors. Thus, the n-type region includes a p-well. The p-well is a portion of the semiconductor that is doped with p-type dopants such as boron. Additionally, the semiconductor substrate 102 also includes a p-type region, meaning that it is intended for use with p-type transistors. Thus, the p-type region may include an n-well. The n-well is a portion of the semiconductor substrate that is doped with n-type dopants such as arsenic and phosphorous.

The relaxed semiconductor layer 104 is formed on the semiconductor substrate 102. The relaxed semiconductor layer 104 may have a thickness that is greater than one micrometer. The relaxed semiconductor layer 104 may be formed through an epitaxial growth process. An epitaxial growth process is a process by which one crystal material is grown on the surface of a substrate crystal material, sometimes referred to as the seed crystal. An epitaxial layer may be grown through use of gaseous or liquid precursors. The material being deposited will lock onto the crystal structure of the seed crystal. An epitaxial grown layer may be doped in-situ by adding dopant-containing species to the source gas.

The relaxed semiconductor layer 104 may be made of, for example, silicon germanium. The addition of germanium into the silicon affects the lattice constant of the crystal structure. The lattice constant is the distance from a point within a unit of the crystal structure to the corresponding point of an adjacent unit of the crystal structure. For example, the lattice constant may be measured from the center of one unit to the center of an adjacent unit. The relaxed semiconductor layer 104 is referred to as such because it has a larger lattice constant than that of adjacent layers. The lattice constant of the relaxed semiconductor layer 104 can be tuned by adjusting the concentration of germanium within the semiconductor layer. The relaxed semiconductor layer 104 may be made of a variety of other materials besides silicon germanium. For example, the relaxed semiconductor material 104 may be made of indium gallium phosphorous (InGaP), indium arsenic (InAs), indium phosphorous (InP), indium gallium arsenic (InGaAs), gallium arsenic (GaAs), indium antimony (InSb), gallium antimony (GaSb), aluminum gallium arsenic (AlGaAs), and other suitable materials.

The tensile strained layer 106 is epitaxially grown on the relaxed semiconductor layer 104. The tensile strained layer may have a thickness within a range of about 40-100 nanometers. The tensile strained semiconductor layer 106 is under tensile strain because it has a smaller lattice constant than the relaxed semiconductor layer 104. Thus, during the epitaxial growth process, when the crystal structure of the tensile strained semiconductor layer 106 locks on to the crystal structure of the underlying relaxed semiconductor layer 104, the units of the tensile strained semiconductor layer 106 are pulled slightly apart, thus causing tensile strain. Such tensile strain is ideal for the channel of n-type devices. The tensile strained semiconductor layer 106 may be made of a variety of other materials besides silicon. For example, the tensile strained semiconductor material 106 may be made of indium gallium phosphorous (InGaP), indium arsenic (InAs), indium phosphorous (InP), indium gallium arsenic (InGaAs), gallium arsenic (GaAs), indium antimony (InSb), gallium antimony (GaSb), aluminum gallium arsenic (AlGaAs), and other suitable materials.

Figure 1B:
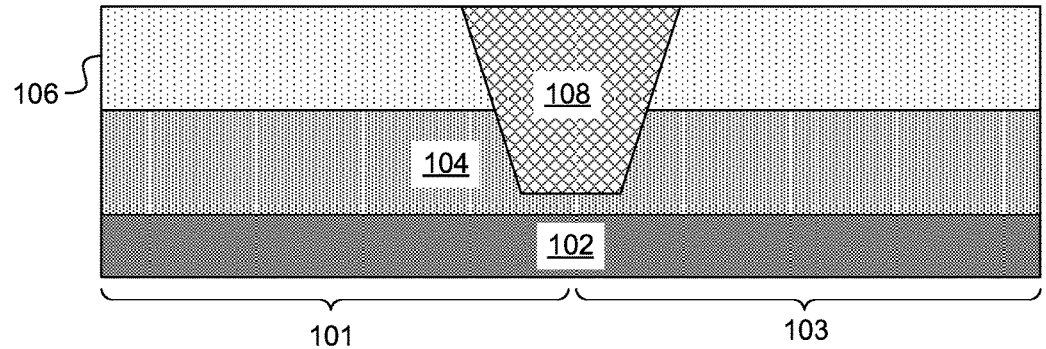

FIG. 1B is a diagram showing formation of an isolation structure 108 between the n-type region 101 and the p-type region. Isolation structures can be patterned to form and isolate various features within the integrated circuit. The isolation structure may be, for example, a shallow trench isolation (STI) structure. Such a structure is formed by etching a shallow trench within the substrate. The trench is then filled with a dielectric material. The dielectric material does not conduct electric current and thus effectively electrically isolates devices from each other. Then, a Chemical Mechanical Polishing (CMP) process is performed on the substrate to planarize the surface of the STI structure. A CMP process involves a slurry that includes both abrasives and chemical etchants. The abrasives perform the mechanical part of the CMP process and the chemical etchants perform the chemical part of the CMP process. A polishing pad then polishes the surface while the CMP slurry is applied.

Figure 1C:
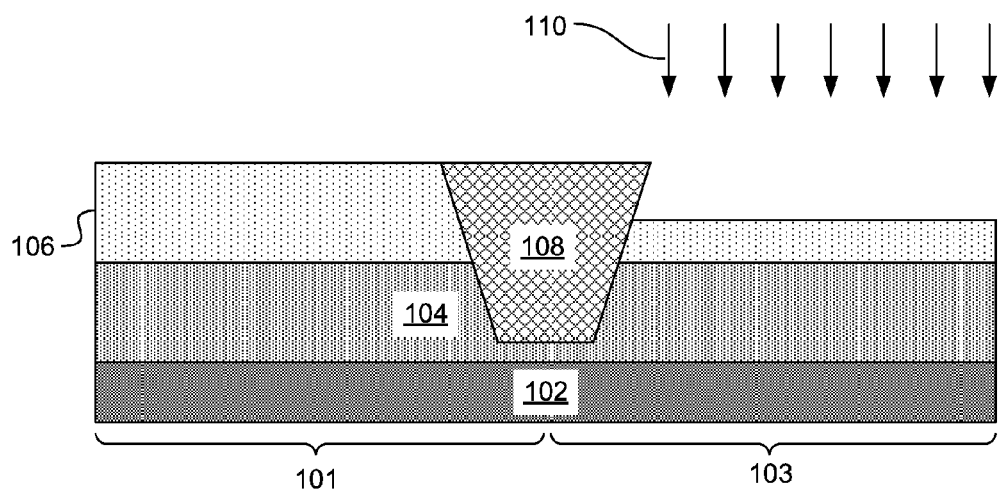

FIG. 1C is a diagram showing an illustrative etching process 110 to remove a portion of the tensile strained semiconductor layer 106 within the p-type region. P-type devices can operate more efficiently with compressive strained channels rather than tensile strained channels. Thus, it is desirable to replace the tensile strained channel with a compressive strained channel.

The etching process 110 may be a dry etching process, in which material from the tensile strained semiconductor layer 106 is removed using a bombardment of ions. Dry etching is anisotropic and thus etches primarily in a single direction. The etching process 110 can be applied in the appropriate location through use of various photolithographic techniques. For example, a mask (not shown) may be used to cover the n-type region while the etching process is performed on the p-type region. Such a mask layer may be formed by depositing the mask material over the entire wafer. Then, a photoresist layer is applied. The photoresist layer is then exposed to a light source through use of a photomask. The photomask is patterned such that some portions of the photoresist are exposed to light and some portions are not. A developing solution is then used to remove the weaker portions of the photoresist layer. An etching process can then be performed to remove the hard mask from regions that are not covered by the photoresist layer. Then, the photoresist layer can be removed, thus leaving the patterned hard mask.

Figure 1D:
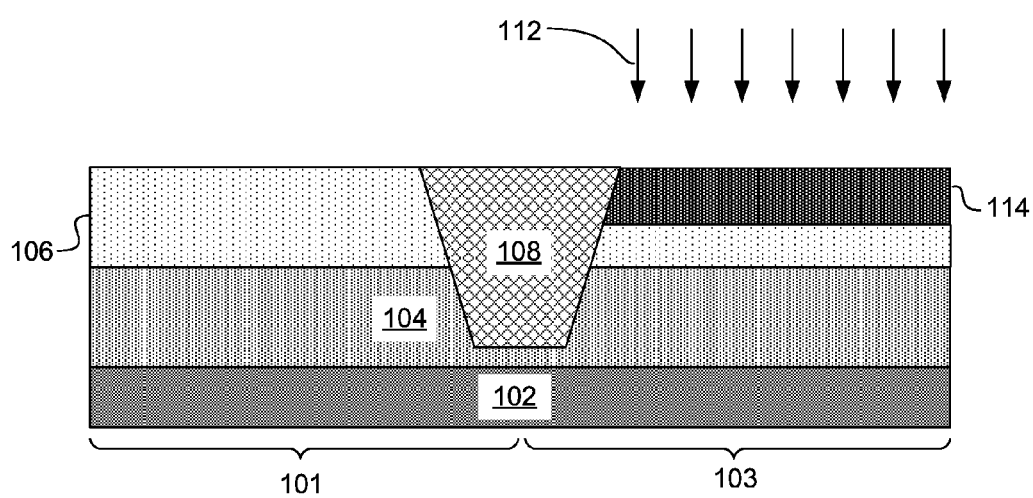

FIG. 1D is a diagram showing an epitaxial growth process 112 by which a compressive strained semiconductor layer 114 is formed. The compressive strained semiconductor layer 114 has a greater lattice constant than that of the tensile strained semiconductor layer 106. Thus, when the compressive strained semiconductor layer 114 is epitaxially grown on the tensile strained semiconductor layer 106, the units of the compressive strained semiconductor layer 114 lock onto the units of the tensile strained semiconductor layer 106, thus causing compressive strain. The compressive strained semiconductor layer 114 may be made of, for example, silicon germanium. The ratio of silicon to germanium may be tuned to achieve the desired lattice constant. The compressive strained semiconductor 114 layer may be made of a variety of other materials besides silicon germanium. For example, the compressive strained semiconductor material may be made of pure germanium (Ge), germanium tin (GeSn) indium gallium phosphorous (InGaP), indium arsenic (InAs), indium phosphorous (InP), indium gallium arsenic (InGaAs), gallium arsenic (GaAs), indium antimony (InSb), gallium antimony (GaSb), aluminum gallium arsenic (AlGaAs), and other suitable materials. The compressive strained semiconductor layer may have a thickness within a range of about 30-90 nanometers.

Figure 1E:
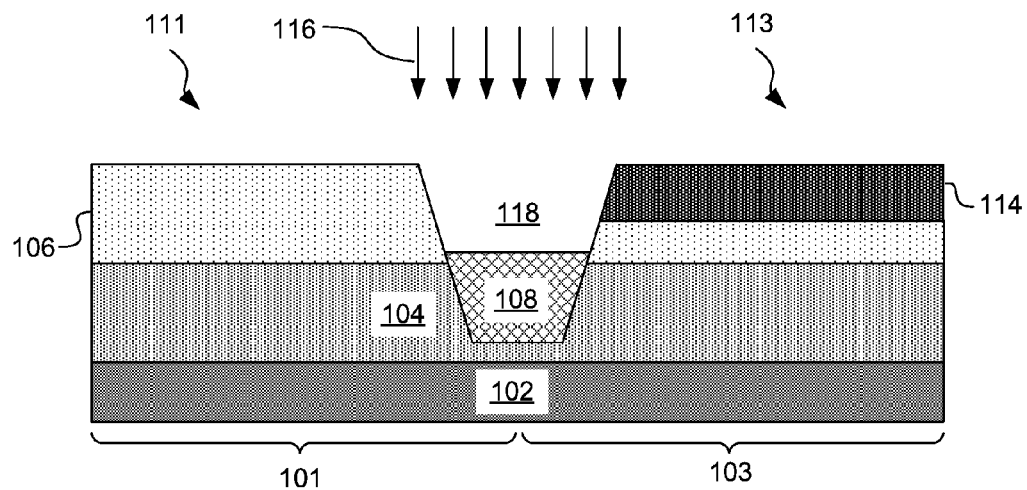

FIG. 1E is a diagram showing an illustrative finFET (fin Field Effect Transistor) formation process. This is done by performing an etching process 116 to remove portions of the isolation structures 108. The etching process 116 is selective such that the material forming the isolation structures is removed while the remaining features are left substantially intact. Specifically, the etching process 116 will leave the tensile strained semiconductor layer 106 and the compressive strained semiconductor layer 114 substantially intact. The result the formation of a first fin-like structure 111 in the n-type region 101 and a second fin-like structure 113 in the p-type region 103. The fin-like structures protrude from the surface of the isolation structures 108 to form fin-like shapes. Such fin-like shapes can provide a number of benefits to transistor devices.

Figure 1F:
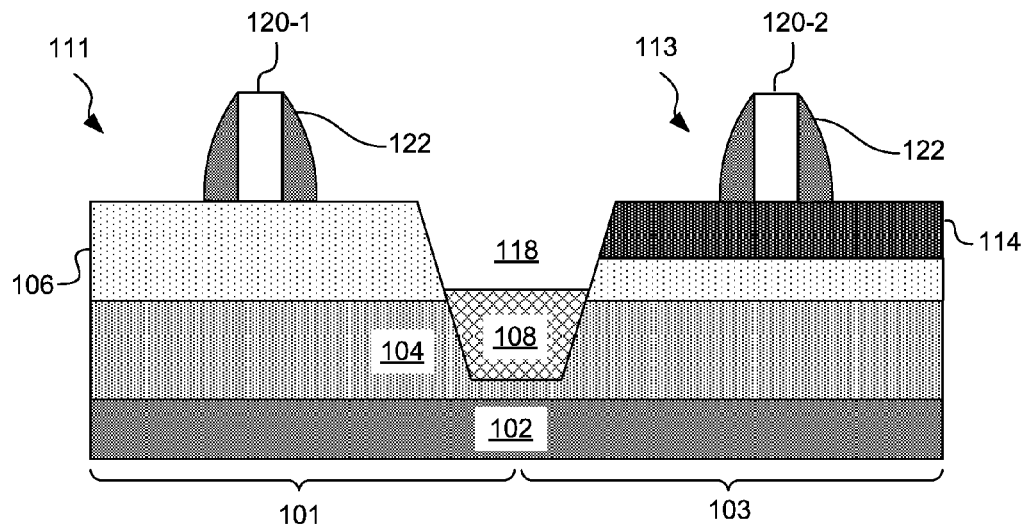

FIG. 1F is a diagram showing formation of gates 120 on the fin-like structures 111, 113. Specifically, a first gate 102-1 is formed in the n-type region 101 on the first fin-like feature 111. A second gate 102-2 is formed in the p-type region 103 on the second fin-like feature 113. In one example, the gates 120 run perpendicular to the underlying fin-like features 111, 113. The gates 120 may also have sidewall spacers 122 formed thereon. The sidewall spacers 122 may be used for a variety of purposes, including defining where source/drain features are to be formed. In some examples, the gates 120 are dummy gates that will be replaced with metal gates at a further point in the fabrication process. The dummy gates may be made of a material such as polysilicon. Because the high temperatures involved in various annealing processes can damage a metal gate, a dummy gate is formed and then replaced with a metal gate after the annealing processes have been performed.

Figure 1G:
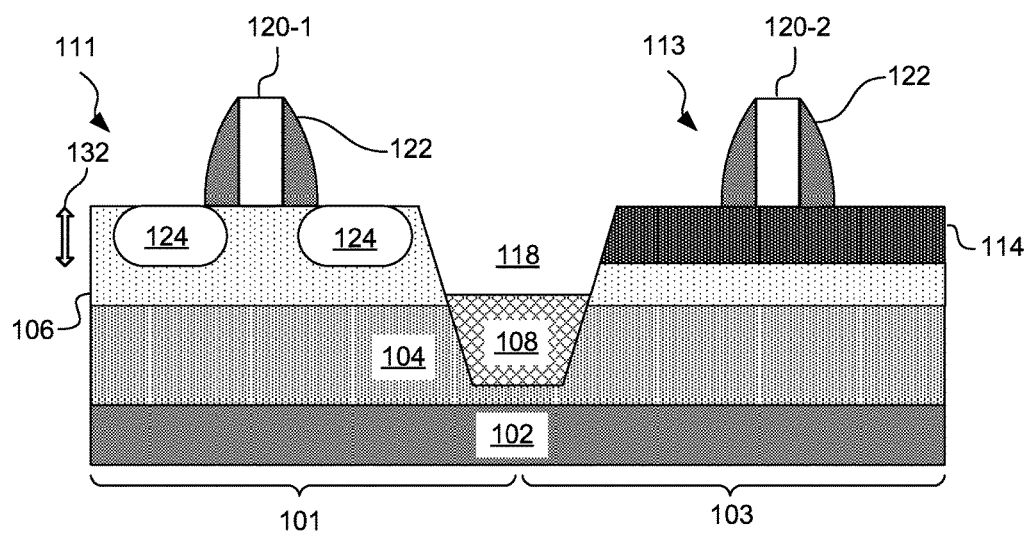

FIG. 1G is a diagram showing formation of source/drain features 124 in the n-type region. In one example, before performing processes in the n-type region, a mask layer (not shown) is deposited on the wafer and then patterned so that it covers the p-type region 103 and exposes the n-type region. The mask may be made of, for example, silicon dioxide (SiO$_2$) or silicon nitride (Si$_3$N$_4$). The mask may be patterned using various photolithographic techniques. For example, as described above, a photoresist layer may be deposited over the mask, exposed to a light source through use of a photomask, and then developed so that the photoresist layer exposes portions of the mask that are to be removed. An etching process then removes the mask from the exposed region. The photoresist layer can then be removed.

The source/drain features 124 are formed by first etching a portion of the tensile strained semiconductor layer 106 to form a recess. The recess may be formed to a specific depth 132 by tuning the etching process. Additionally, the recess may be formed with a rounded profile. The recess is then filled with the source/drain material. The source/drain material may be formed in the recess using an epitaxial growth process. The source/drain material for the n-type region can be a material that has a smaller lattice constant than that of the tensile strained semiconductor layer 106. For example, the source/drain features 124 may be made of silicon carbon (SiC). This produces even more tensile strain on the channel between the source/drain features 124. This is because the channel material tends to swell as the source/drain features 124 tend to shrink.

The source/drain features 124 are also doped with an n-type dopant such as boron. The doping of the source/drain features 124 may be performed in-situ with the epitaxial growth process. Alternatively, the doping of the source/drain features 124 may be performed in a separate process after the source/drain features have been epitaxially grown.

Figure 1H:
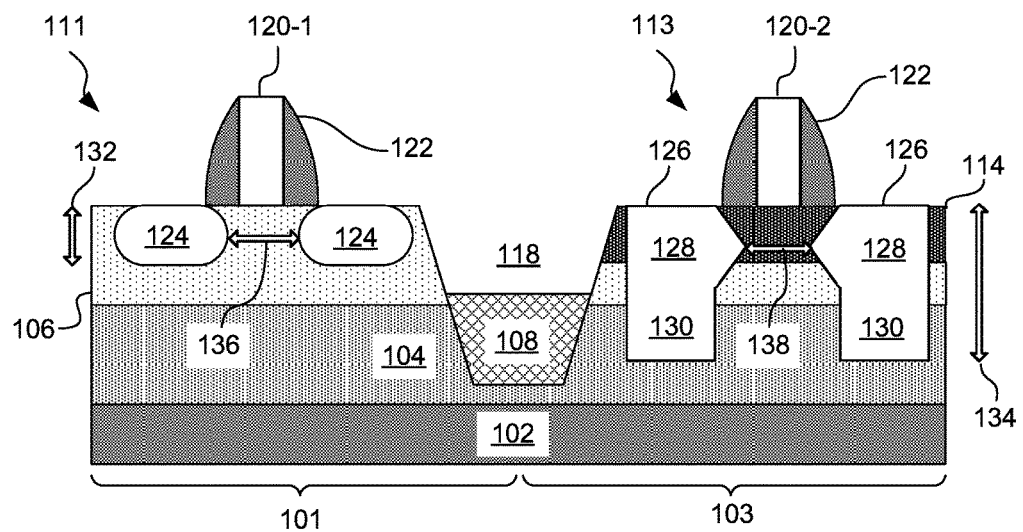

FIG. 1H is a diagram showing formation of source/drain features 126 in the p-type region 103. In one example, before performing processes in the p-type region, a second mask layer (not shown) is deposited on the wafer and then patterned so that it covers the n-type region 101 and exposes the p-type region 103.

The source/drain features 126 are formed by first etching a portion of the compressive strained semiconductor layer 114 to form a recess. The recess may be formed to a specific depth 134. Additionally, the recess may be performed with a specific profile. For example, the profile may have a lower portion 130 and an upper portion 128. The lower portion 130 has a straight profile. The upper portion has a profile with a vertex or tip pointing towards the channel.

The profile of the upper portion 128 may be formed by a multi-step etching process that involves both wet etching and dry etching. For example, the etching process to form the recesses of the source/drain features 126 can alternate between wet etching and dry etching steps. Wet etching uses chemical etchants to remove material. Wet etching is isotropic and thus will generally etch in all directions. But, the crystal structure of the material being moved can affect the etching rates in different directions. For example, the etching rate along one axis may be different than an etching rate along a different axis. Thus, by tuning the crystal structure of the compressive strained semiconductor layer 114 and the tensile strained semiconductor layer 106, as well as tuning the multi-step etching process, the desired profile can be achieved.

The recess is then filled with the source/drain material. The source/drain material may be formed in the recess using an epitaxial growth process. The source/drain material for the p-type region can be a material that has a greater lattice constant than that of the compressive strained semiconductor layer 114. For example, the source/drain features 126 may be made of silicon germanium. But, the silicon germanium of the source/drain features 126 may have a higher concentration of germanium than that of the silicon germanium of the compressive strained semiconductor layer 114, which causes it to have a greater lattice constant. This causes the channel between the p-type source/drain features 126 to be even more compressed.

The source/drain features 126 are also doped with a p-type dopant such as phosphorous. The doping of the source/drain features 126 may be performed in-situ with the epitaxial growth process. Alternatively, the doping of the source/drain features 126 may be performed in a separate process after the source/drain features 126 have been epitaxially grown.

Because the recess for the p-type source/drain features 126 is formed at a depth 134 that is deeper than the depth at which the recess for the n-type source/drain features 124 are formed, the p-type source/drain features extend deeper than the n-type source/drain features 124. In the present example, the n-type source drain regions do not extend into the relaxed semiconductor layer 104. The p-type source/drain features, however, do extend into the relaxed semiconductor layer 104.

Due to the different types of profiles, the channel length 136 for the n-type device 111 is different than the channel length 138 of the p-type device 113. Specifically, the channel length 138 of the p-type device 113 is smaller than the channel length 136 of the n-type device 111. The smaller channel length 138 of the p-type device 113 helps improve the performance of the p-type device 113.

According to principles described herein, there are asymmetric depths between the source/drain features 124 of the n-type region and the source/drain features 126 of the p-type region. The asymmetric depths allow for optimization of the channel strain between the n-type and p-type devices, particularly, transistors. In one example, the depth of the source/drain features 124 in the n-type region 101 is within a range of about 30-60 nanometers. In one example, the depth of the source/drain features 126 in the p-type region is within a range of about 40-100 nanometers.

Figure 2A:
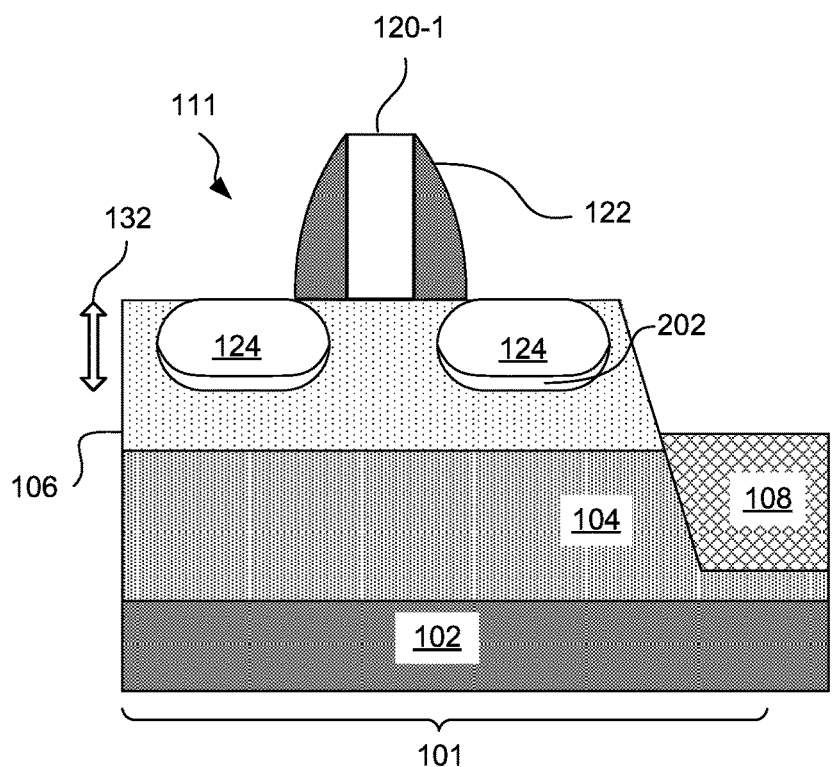
FIGS. 2A and 2B are diagrams showing doping concentrations of source/drain features, according to one example of principles described herein.
Figure 2B:
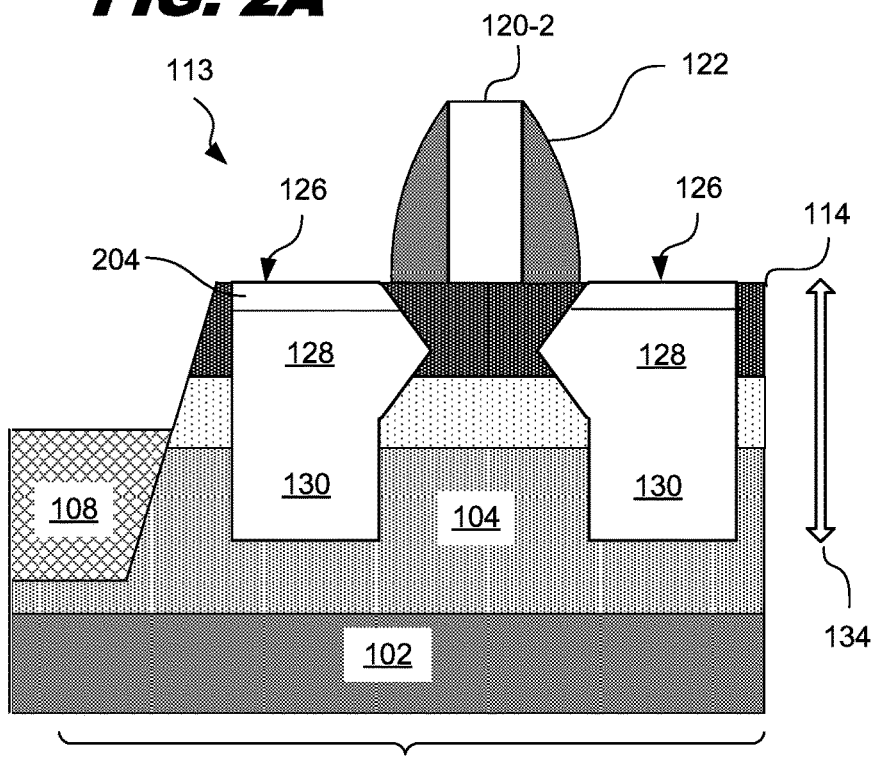

FIGS. 2A-2B are diagrams showing doping concentrations of source/drain features. FIG. 2A is a diagram showing illustrative doping concentrations for the n-type region 101. According to the present example, the source/drain features 124 have a doping concentration of about 3×10$^{21}$/cm$^3$. Additionally, the source/drain features have a lower portion 202 with a lower concentration along the bottom of the source/drain features 124. This lower portion 202 may have a concentration of about 7×10$^{20}$/cm$^3$. In some examples, the lower portions 202 are formed first, and are doped with the appropriate doping concentration. Then, the rest of the source/drain features 124 are formed with the appropriate doping concentration.

FIG. 2B is a diagram showing illustrative doping concentrations for the p-type region 103. According to the present example, the source/drain features 126 have a doping concentration of about 6×10$^{20}$/cm$^3$. Additionally, the source/drain features have upper portions 204 with a higher concentration along the top of the source/drain features 126. These upper portions 204 may have a concentration of about 1×10$^{21}$/cm$^3$. In some examples, the lower portions of the source/drain features 126 are formed with the appropriate doping concentration. Then, the upper portions 204 of the source/drain features 126 are formed with the appropriate doping concentration. Thus, both the n-type source/drain features 124 and the p-type source/drain features have a higher doping concentration towards the top than at the bottom.

Figure 3:
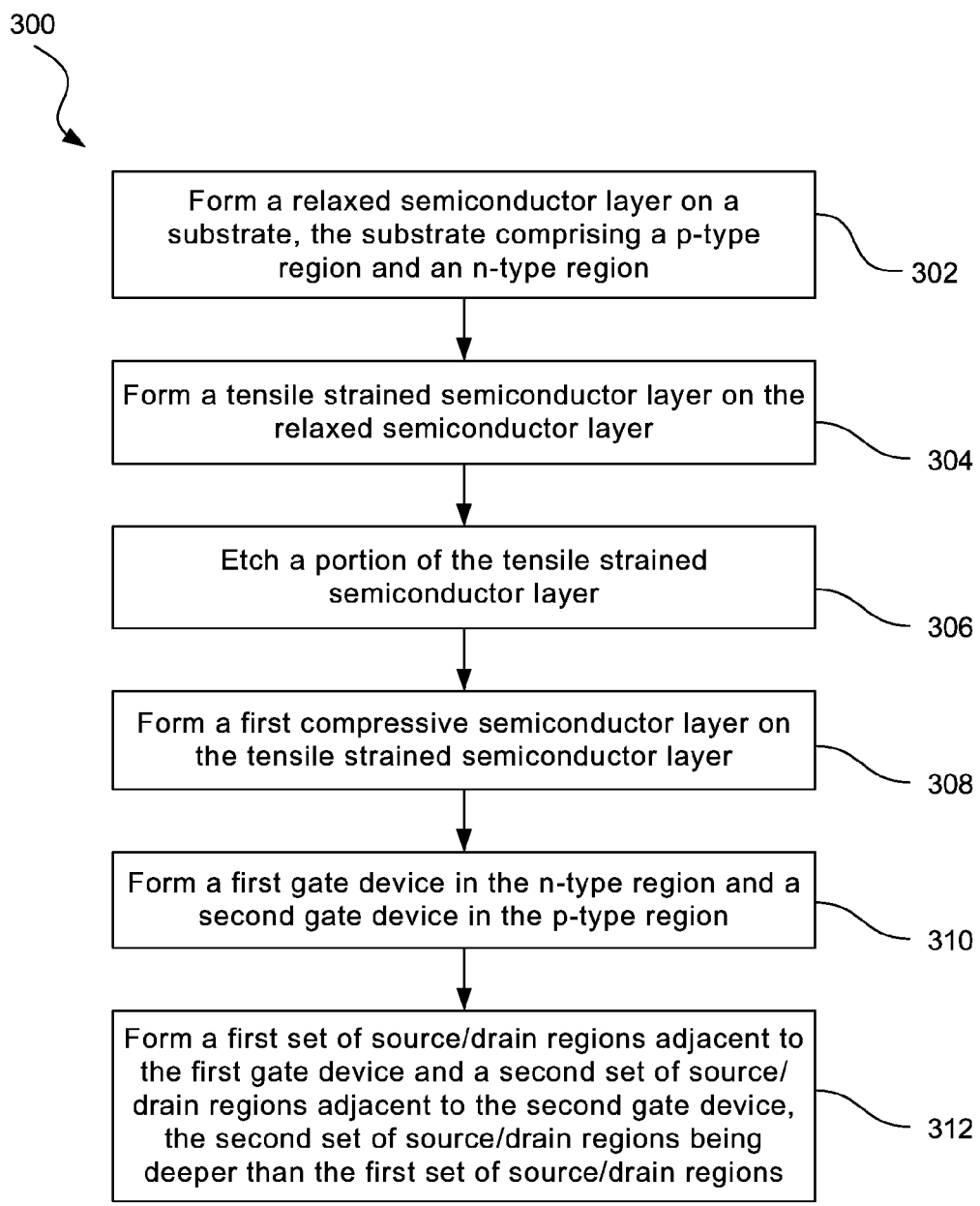
FIG. 3 is a flowchart showing an illustrative method for forming devices with asymmetric source/drain depths, according to one example of principles described herein.

FIG. 3 is a flowchart showing an illustrative method for forming devices, such as transistors, with asymmetric source/drain depths. According to the present example, the method 300 includes a step 302 for forming a relaxed semiconductor layer on a substrate, the substrate comprising an n-type region and a p-type region. The n-type region is intended for n-type devices and thus includes a p-well. The p-type region is intended for p-type devices and thus includes an n-well. In some examples, the n-type region and the p-type region are separated by an isolation structure such as an STI region. The relaxed semiconductor layer may be made of silicon germanium, for example. The relaxed semiconductor layer may be formed using an epitaxial growth process.

The method 300 further includes a step 304 for forming a tensile strained semiconductor layer on the relaxed semiconductor layer. The tensile strained semiconductor layer may be formed using an epitaxial growth process. The tensile strained semiconductor layer has a smaller lattice constant than the relaxed semiconductor layer, thus causing the tensile strain. The tensile strained semiconductor layer can be used as a channel material for n-type transistors.

The method 300 further includes a step 306 for etching a portion of the tensile strained semiconductor layer. This is done in the p-type region where a p-type device is to be formed. The etching may be done through use of a dry etching process. Other etching processes may be used as well.

The method 300 further includes a step 308 for forming a compressive strained semiconductor layer on the tensile strained semiconductor layer in the p-type region where the portion of the tensile strained semiconductor material was removed. The compressive strained semiconductor layer has a greater lattice constant than that of the tensile strained semiconductor layer, which causes the compressive strain.

The method further includes a step 310 for forming a first gate in the n-type region and a second gate in the p-type region. The gates may include gate spacers. In some examples, before the gates are formed, the isolation structures are partially etched back so that the semiconductor features form fin-like structures.

The method 300 further includes a step 312 for forming a first set of source/drain features adjacent to the first gate and a second set of source/drain features adjacent to the second gate, the second set of source/drain features being deeper than the first set of source/drain features. By having the source/drain features of the p-type device deeper than the source/drain features of the n-type device, the channel strain for respective devices can be optimized. Specifically, performance is enhanced in n-type devices when the channel is tensile strained. Conversely, performance is enhanced in p-type devices when the channel is compressive strained. The material for the source/drain features in the n-type device can be selected to further enhance the tensile strain by having a material with a smaller lattice constant than that of the channel. Likewise, the material for the source/drain features in the p-type device can be selected to enhance the compressive strain by having a material with a larger lattice constant than that of the channel.

Additionally, the profile of the source/drain features between the two different sets of source/drain features. Specifically, the source/drain features for the n-type device may have rounded profiles and the source/drain features for the p-type device may have a vertex or tip. Furthermore, the channel length for the p-type devices may be smaller than the channel length for the n-type devices. In some examples, the doping concentration may also be graded. Specifically there may be a higher doping concentration towards the top of the source/drain region. Moreover, the gradient profile may differ between the source/drain features of the n-type device and the source/drain features of the p-type device.

According to one example, a semiconductor device includes a relaxed semiconductor layer on a substrate, the substrate comprising an n-type region and a p-type region, a tensile strained semiconductor layer on the relaxed semiconductor layer, a compressive strained semiconductor layer on the tensile strained semiconductor layer in the p-type region, a first gate in the n-type region and a second gate in the p-type region, and a first set of source/drain features adjacent to the first gate and a second set of source/drain features adjacent to the second gate, the second set of source/drain features being deeper than the first set of source/drain features.

According to one example, a semiconductor device includes a substrate having a first region and a second region, an n-type transistor in the first region, the n-type transistor comprising a first set of source/drain features, and a p-type transistor in the second region, the p-type transistor comprising a second set of source/drain features. The second set of source/drain features extend deeper than the first set of source/drain features.

According to one example, a method of fabricating a semiconductor device includes forming a relaxed semiconductor layer on a substrate, the substrate comprising an n-type region and a p-type region, forming a tensile strained semiconductor layer on the relaxed semiconductor layer, etching a portion of the tensile strained semiconductor layer in the p-type region, forming a compressive strained semiconductor layer on the tensile strained semiconductor layer in the p-type region, forming a first gate in the n-type region and a second gate in the p-type region, forming a first set of source/drain features adjacent to the first gate and a second set of source/drain features adjacent to the second gate, the second set of source/drain features being deeper than the first set of source/drain features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   forming a relaxed semiconductor layer on a substrate, the substrate comprising an n-type region and a p-type region;
   forming a tensile strained semiconductor layer on the relaxed semiconductor layer;
   forming a compressive strained semiconductor layer on the tensile strained semiconductor layer in the p-type region;
   forming a first gate in the n-type region and a second gate in the p-type region; and
   forming a first set of source/drain features adjacent to the first gate and a second set of source/drain features adjacent to the second gate, the second set of source/ drain features being deeper than the first set of source/drain features, wherein a channel length between the first set of source/drain features is greater than a channel length between the second set of source/drain features.

2. The method of claim 1, further comprising, an isolation structure between the p-type region and the n-type region.

3. The method of claim 1, wherein the second set of source/drain features comprise a tip-shaped profile.

4. The method of claim 3, wherein the tip-shaped profile is in an upper portion of the second set of source/drain features and a lower portion of the second set of source/drain features comprises a straight profile.

5. The method of claim 1, wherein the first set of source/drain features have a rounded profile on a side that faces a channel between the first set of source/drain features.

6. The method of claim 1, wherein a lattice constant of the tensile strained semiconductor layer is less than a lattice constant of the relaxed semiconductor layer.

7. The method of claim 1, wherein a lattice constant of the compressive strained semiconductor layer is greater than a lattice constant of the relaxed semiconductor layer.

8. The method of claim 1, wherein a lattice constant of the first set of source/drain features is less than a lattice constant of the tensile strained semiconductor layer.

9. The method of claim 1, wherein a lattice constant of the second set of source/drain features is greater than a lattice constant of the compressive strained semiconductor layer.

10. The method of claim 1, wherein the first set of source/drain features and the second set of source/drain features have a higher dopant concentration on top than on bottom.

11. The method of claim 1, wherein the first set of source/drain features do not extend to the relaxed semiconductor layer.

12. The method of claim 1, wherein the second set of source/drain features extends into the relaxed semiconductor layer.

13. A method for forming a semiconductor device, the method comprising:
   providing a substrate having a first region and a second region;
   forming an n-type transistor in the first region, the n-type transistor comprising a first set of source/drain features; and
   forming a p-type transistor in the second region, the p-type transistor comprising a second set of source/drain features;
   wherein the second set of source/drain features extend deeper than the first set of source/drain features.

14. The method of claim 13, wherein the p-type transistor and the n-type transistor are fin Field Effect Transistors (finFETs).

15. The method of claim 13, wherein a channel of the n-type transistor comprises a tensile strained material and a channel of the p-type transistor comprises a compressive strained material.

16. The method of claim 13, wherein a portion along a bottom of the first set of source/drain features comprises a higher concentration of n-type dopants than a remaining portion of the first set of source/drain features.

17. The method of claim 13, wherein a portion along a top of the second set of source/drain features comprises a higher concentration of p-type dopants than a remaining portion of the second set of source/drain features.

18. A method of fabricating a semiconductor device, the method comprising:
   forming a relaxed semiconductor layer on a substrate, the substrate comprising an n-type region and a p-type region;
   forming a tensile strained semiconductor layer on the relaxed semiconductor layer;
   etching a portion of the tensile strained semiconductor layer in the p-type region;
   forming a compressive strained semiconductor layer on the tensile strained semiconductor layer in the p-type region;
   forming a first gate in the n-type region and a second gate in the p-type region;
   forming a first set of source/drain features adjacent to the first gate and a second set of source/drain features adjacent to the second gate, the second set of source/drain features being deeper than the first set of source/drain features.

19. The method of claim 18, further comprising, forming an isolation structure between the p-type region and the n-type region.

20. The method of claim 19, further comprising, after forming the compressive semiconductor layer, etching the isolation structure to form a first fin-like structure in the n-type region and a second fin-like structure in the p-type region.

* * * * *